(12) United States Patent
Jing

(10) Patent No.: US 9,834,437 B2
(45) Date of Patent: Dec. 5, 2017

(54) METHOD FOR MANUFACTURING MEMS TORSIONAL ELECTROSTATIC ACTUATOR

(71) Applicant: CSMC TECHNOLOGIES FAB1 CO., LTD., Jiangsu (CN)

(72) Inventor: Errong Jing, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 15/327,230

(22) PCT Filed: Jul. 31, 2015

(86) PCT No.: PCT/CN2015/085765
§ 371 (c)(1),
(2) Date: Jan. 18, 2017

(87) PCT Pub. No.: WO2016/086682
PCT Pub. Date: Jun. 9, 2016

(65) Prior Publication Data
US 2017/0174508 A1 Jun. 22, 2017

(30) Foreign Application Priority Data
Dec. 2, 2014 (CN) .......................... 2014 1 0724507

(51) Int. Cl.
*B81C 1/00* (2006.01)
*B81B 3/00* (2006.01)

(52) U.S. Cl.
CPC ........ *B81C 1/00182* (2013.01); *B81B 3/0021* (2013.01); *B81B 2203/0118* (2013.01);
(Continued)

(58) Field of Classification Search
None
See application file for complete search history.

(56) References Cited

U.S. PATENT DOCUMENTS

| 2005/0139993 A1 | 6/2005 | Lee et al. |
| 2005/0173234 A1* | 8/2005 | Nielson .................. H01H 47/00 200/181 |
| 2010/0296151 A1* | 11/2010 | Hofmann .............. B81B 3/0054 359/291 |

FOREIGN PATENT DOCUMENTS

| CN | 1405593 A | 3/2003 |
| CN | 1552615 A | 12/2004 |

(Continued)

OTHER PUBLICATIONS

Li Da Chao; "Chinese Doctoral Dissertations Full Text Database"; "Silicon Micro Mechanical Torsional Mirror and Its Dynamic Testing Technology Research"; No. 96-9S; pp. 1-10; Issue date Nov. 15, 2006.

*Primary Examiner* — Asok K Sarkar
(74) *Attorney, Agent, or Firm* — Muncy, Geissler, Olds & Lowe, P.C.

(57) ABSTRACT

A method for manufacturing an MEMS torsional electrostatic actuator comprises: providing a substrate, wherein the substrate comprises a first silicon layer, a buried oxide layer and a second silicon layer that are laminated sequentially; patterning the first silicon layer and exposing the buried oxide layer to form a rectangular upper electrode plate separated from a peripheral region, wherein the upper electrode plate and the peripheral region are connected by only using a cantilever beam, and forming, on the peripheral region, a recessed portion exposing the buried oxide layer; patterning the second silicon layer and exposing the buried oxide layer to form a back cavity, wherein the back cavity is located in a region of the second silicon layer corresponding to the upper electrode plate, covers 40% to 60% of the area of the region corresponding to the upper electrode plate, and is close to one end of the cantilever beam; exposing the second silicon layer, and suspending the upper electrode
(Continued)

plate and the cantilever beam; and respectively forming an upper contact electrode and a lower contact electrode on the second silicon layer.

11 Claims, 3 Drawing Sheets

(52) U.S. Cl.
CPC ... *B81B 2203/0315* (2013.01); *B81B 2203/04* (2013.01); *B81C 2201/0109* (2013.01); *B81C 2201/0111* (2013.01)

(56) References Cited

FOREIGN PATENT DOCUMENTS

| | | |
|---|---|---|
| CN | 1782779 A | 6/2006 |
| CN | 1821830 A | 8/2006 |
| CN | 101549848 A | 10/2009 |
| CN | 101587240 A | 11/2009 |
| CN | 101827781 A | 9/2010 |
| CN | 101840781 A | 9/2010 |
| CN | 101907769 A | 12/2010 |
| CN | 102175891 B | 11/2012 |
| CN | 103288034 A | 9/2013 |
| CN | 103345057 A | 10/2013 |
| JP | 2005321663 A | 11/2005 |
| JP | 2012047910 A | 3/2012 |

\* cited by examiner

US 9,834,437 B2

METHOD FOR MANUFACTURING MEMS TORSIONAL ELECTROSTATIC ACTUATOR

FIELD OF THE INVENTION

The present disclosure relates to a technical field of semiconductors, and more particular relates to a method of manufacturing an MEMS torsional electrostatic actuator.

BACKGROUND OF THE INVENTION

MEMS micro-actuator, also known as an executing unit or actuating unit, is a device which can transfer energy into a controllable movement and a power output according to a control signal. Micro-actuator is an important MEMS device, and is widely applied to the fields such as optics, communication, biomedical science, and micro-fluidics. The micro-actuator mainly includes a transducer which transfers an electric energy into a mechanical energy, and a microstructure which performs a power output. According to an energy source, actuators can be divided into an electrical actuator, a magnetic actuator, a thermal actuator, an optic actuator, a mechanical actuator, an acoustic actuator, a chemical actuator and a biological actuator, the common driving modes include an electrostatic mode, an electromagnetic mode, an electro-thermal mode, a piezoelectric mode, a memory alloy mode, an electrostriction mode, and a magnetostriction mode.

The electrostatic actuator takes advantages of an electrostatic attraction between the energized conductors to realize a drive. An efficient of the electrostatic drive is relative higher when in a small size (1 to 10 micrometers), and it is easy to be implemented and accurately controlled, and special materials are not required, it is the most widely used driving mode. The electrostatic actuator includes a plate capacitor structure, a comb fork structure, a rotatable electrostatic motor, and a linear long distance actuator, which takes advantage of electrostatic forces along a perpendicular direction and a parallel direction.

The plate capacitor actuator is a commonly used electrostatic actuator, the lower electrode plate of the capacitor is fixed, and the upper electrode plate can move when it is supported by an elastic structure. When a driving voltage is applied to the upper electrode plate and the lower electrode plate, the electrostatic attraction between the plates drives the whole upper electrode plate to move perpendicularly, and an output is realized. The manufacture of the plate capacitor actuator is simple, and it is can be easily controlled and used, but a driving distance is little, and an output force is little. The output driving force and the capacitor has non-linear relationship, and a push down is easy to emerge when it is controlled by a voltage, an effective driving distance is limited. In addition, when in a dynamic condition, the damping of the pressed film of the plate capacitor is relative larger, limiting the dynamic range.

The torsional electrostatic actuator takes advantage of a torsional cantilever beam and an electrostatic force to torque the upper electrode plate to realize an output, the torsional electrostatic actuator has a better performance, this is because the torsion movement can output a relative larger driving force than a perpendicular movement. The conventional torsional electrostatic actuator has a relative small output force due to the limitation of the manufacture technology.

SUMMARY

Accordingly, it is necessary to provide a method of manufacturing an MEMS torsional electrostatic actuator which can manufacture an MEMS torsional electrostatic actuator having a greater output force.

A method of manufacturing an MEMS torsional electrostatic actuator includes:

providing a substrate including a first silicon layer, a buried oxide layer, and a second silicon layer that are laminated sequentially;

patterning the first silicon layer and exposing the buried oxide layer to form a rectangular upper electrode plate spaced apart from a peripheral region, wherein the upper electrode plate is connected to the peripheral region merely via a cantilever beam, and forming a recessed portion on the peripheral region to expose the buried oxide layer simultaneously; patterning the second silicon layer and exposing the buried oxide layer to form a back cavity, wherein the back cavity is located in a region of the second silicon layer corresponding to the upper electrode plate, and the back cavity covers 40% to 60% of the area of the region corresponding to the upper electrode plate, and the back cavity is adjacent to an end of the cantilever beam;

removing the buried oxide layer that is exposed from the recessed portion to expose the second silicon layer, and removing partial buried oxide layer to suspend the upper electrode plate and the cantilever beam; and forming an upper contact electrode and a lower contact electrode on the peripheral region and the second silicon layer exposed from the recessed portion, respectively.

In the method of manufacturing an MEMS torsional electrostatic actuator, the silicon-on-insulator (SOI) serves as a substrate, by patterning the first silicon layer, the buried oxide layer and the second silicon layer, the upper electrode plate is formed on the first silicon layer, a lower electrode plate (a region of the second silicon layer that is not covered by the back cavity and corresponds to the upper electrode plate) is formed on the second silicon layer, the buried oxide layer serves as an insulating layer and a sacrificial layer between the upper electrode plate and the lower electrode plate, the overlapping area between the upper electrode plate and the lower electrode plate is about 40% to 60%. When a voltage is applied to the upper contact electrode and the lower contact electrode, the upper electrode plate will move due to the electrostatic force. Because the upper electrode plate and the lower electrode plate are not completely overlapped (having a difference of 40% to 60%), the upper electrode plate is subject to an uneven force. An electrostatic force subjected by the portion of the upper electrode plate corresponding to the lower electrode plate is greater than an electrostatic force subjected by a corresponding portion of the back cavity, thus causing the cantilever beam to be distorted and the upper electrode plate to take a torsion movement, this is so-called MEMS torsional electrostatic actuator, also known as MEMS torsional capacitor actuator. The MEMS torsional electrostatic actuator takes advantage of the torque cantilever beam and the electrostatic force to drive the upper electrode plate to be torque, thus a relatively large driving force output and a relative larger dynamic range are achieved. In addition, SOI has a relative larger thickness, a better consistency and a lower residual stress, therefore the manufacturing process is easy to control, and the manufactured MEMS torsional electrostatic actuator has a better performance due to the relative low residual stress.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The embodiment of the invention will be specifically illustrated with reference to the following description.

MEMS torsional electrostatic actuator, also known as MEMS torsional capacitor actuator, includes a static lower electrode plate and a movable upper electrode plate, it takes advantage of a generated torsion of the upper electrode plate when it is subjected to an uneven electrostatic force to realize an output of a driving force. The MEMS torsional electrostatic actuator has a better performance, this is because the tortional movement has a greater driving force and dynamitic range than that the perpendicular movement.

Figure 1:
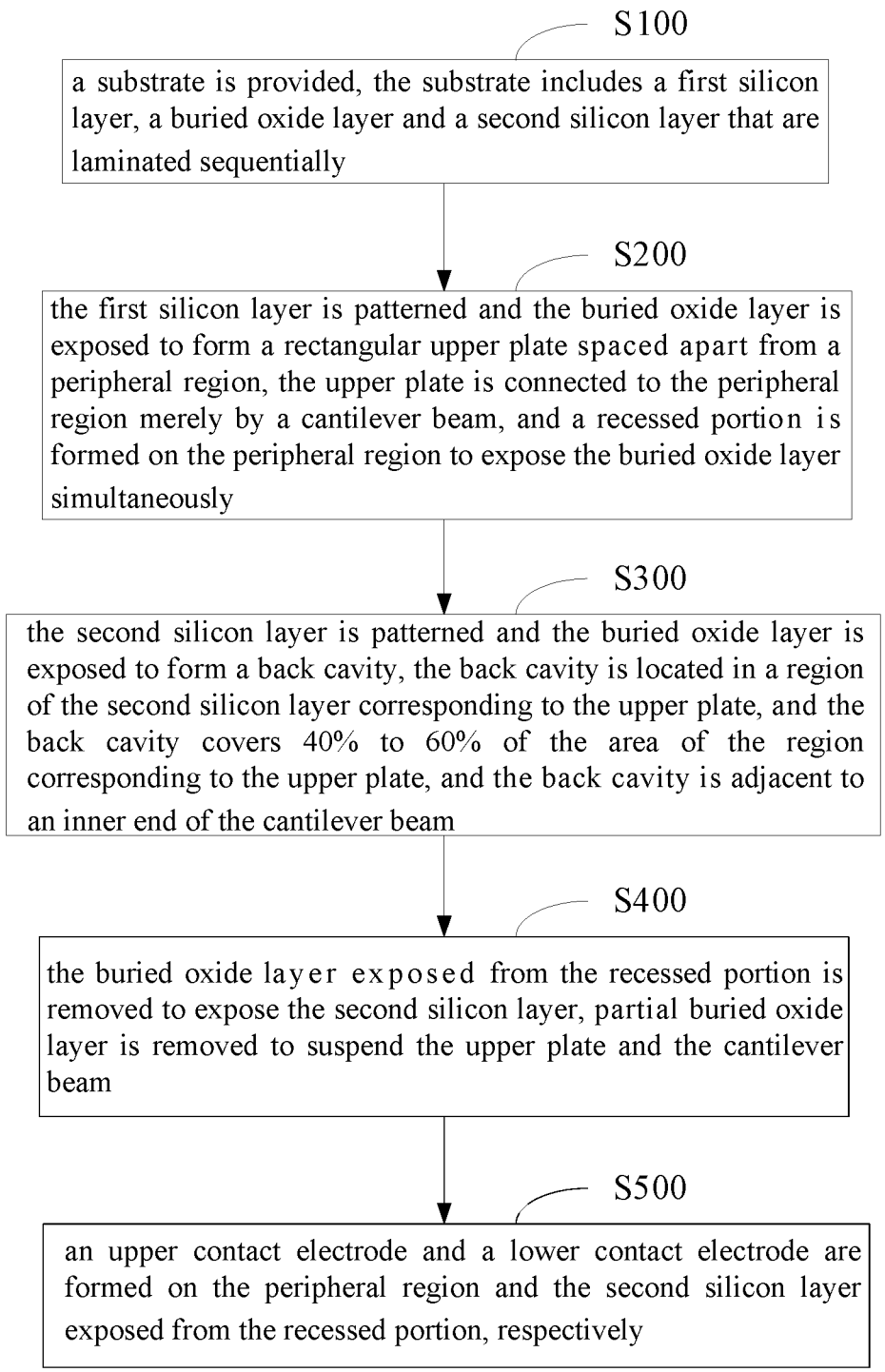
FIG. 1 is a flow chart of a method of manufacturing an MEMS torsional electrostatic actuator according to an embodiment.

Referring to FIG. 1, a method of manufacturing an MEMS torsional electrostatic actuator includes steps as follows:

In step S100, a substrate 10 is provided, the substrate 10 includes a first silicon layer 100, a buried oxide layer 200, and a second silicon layer 300 that are laminated sequentially.

Figure 2:
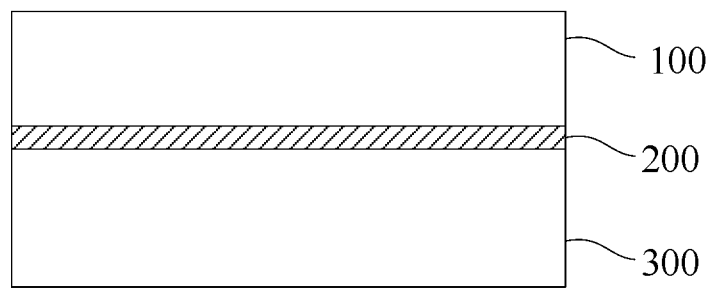
FIG. 2 is a schematic view of a substrate.

Referring also to FIG. 2, the substrate 10 can be a silicon-on-insulator (SOI), which has a relative large thickness, a better consistency and a lower residual stress.

The resistivity of the first silicon layer 100 and the second silicon layer 300 are relative low, e.g., from 0.00152 Ω·cm to 0.0152 Ω·cm, such that they can be directly employed as conductive materials. The first silicon layer 100 and the second silicon layer 300 can be made of monocrystalline silicon, because the residual stress and surface smoothness of the monocrystalline can easily meet a manufacturing requirement for the MEMS torsional electrostatic actuator.

The first silicon layer 100 has a thickness ranging from 5 micrometers to 50 micrometers, the buried oxide layer 200 has a thickness ranging from 0.5 micrometers to 2 micrometers, the second silicon layer 300 has a thickness ranging from 400 micrometers to 600 micrometers. In the illustrated embodiment, the buried oxide layer 200 is a silicon-dioxide layer, in the alternative embodiment, it can be other insulating layer. The buried oxide layer 200 has a thickness equal to that of a gap of the torsional capacitor, the buried oxide layer 200 serves as an insulating layer and sacrificial layer between the first silicon layer 100 and the second silicon layer 300.

In step S200, the first silicon layer 100 is patterned and the buried oxide layer 200 is exposed to form a rectangular upper electrode plate 120 spaced apart from a peripheral region 140, the upper electrode plate 120 is connected to the peripheral region 140 merely by a cantilever beam 130, and a recessed portion 110 exposing the buried oxide layer 200 is formed on the peripheral region 140 simultaneously. An etching patterning is performed to the first silicon layer 100 from a front surface of the substrate 100 by a silicon etching technology, until the buried oxide layer 200 is exposed.

Figure 3:
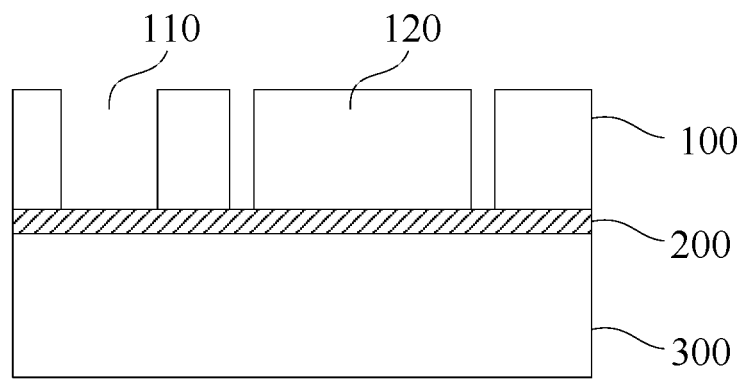
FIG. 3 is a schematic view of a first silicon layer after patterning.
Figure 4:
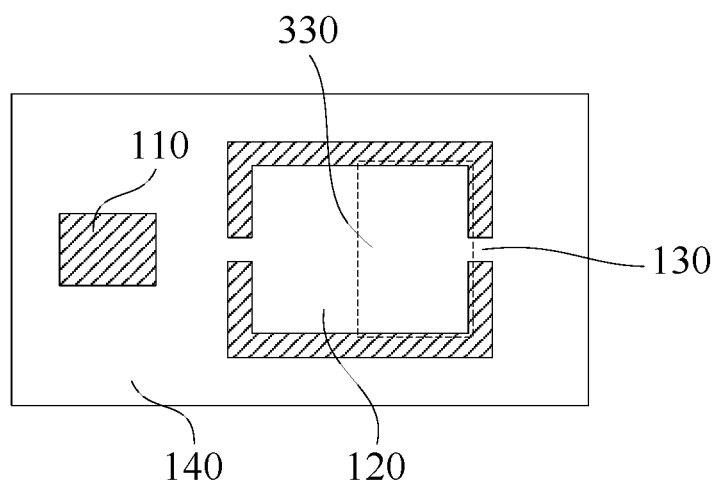
FIG. 4 is a top view of a first silicon layer after patterning.

Also referring to FIG. 3 and FIG. 4, the first silicon layer 100 is divided into the quadrilateral upper electrode plate 120 and the peripheral region 140 by two U-shaped grooves which join together, two tiny cantilever beams 130 are formed on the joint position of the two U-shaped grooves. The cantilever beams 130 connects the upper electrode plate 120 with the peripheral region 140, the quadrilateral recessed portion 110 is located on the peripheral region 140. The cantilever beam 130 is tiny enough, and can easily generate torsion under an electrostatic force, and causes the upper electrode plate 120 to generate torsion.

In step S300, the second silicon layer 300 is patterned and the buried oxide layer 200 is exposed to form a back cavity 310, an etching patterning is performed to the second silicon layer 300 from a rear surface of the substrate 10, until the buried oxide layer 200 is exposed. The back cavity 310 has a shape corresponding to that of the upper electrode plate 120, and both are quadrilateral, the back cavity 310 is located in a region of the second silicon layer 300 corresponding to the upper electrode plate 120, the back cavity 310 covers 40% to 60% of the area 330 of the region corresponding to the upper electrode plate 120, and is adjacent to an inner end of any one of the cantilever beams, referring to FIG. 4. Such design is used for the cantilever beam 130 can be easily generate a deformation torsion under an electrostatic force, and causes the upper electrode plate 120 to generate torsion. In the embodiment, the back cavity 310 covers 50% of the area of the region corresponding to the upper electrode plate 120 which is adjacent to the inner end of any one of the cantilever beams, i.e. the etched pattern should cover a half area of the region corresponding to the upper electrode plate.

Figure 5:
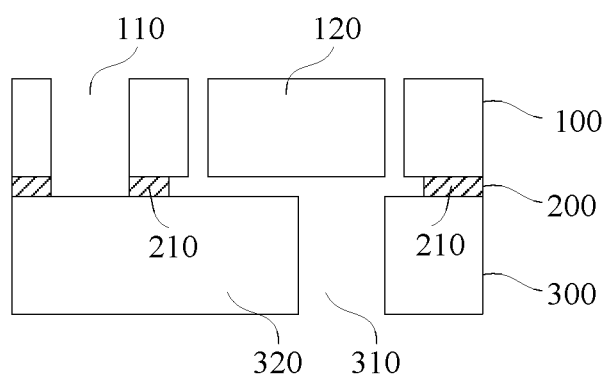
FIG. 5 is a schematic view of a suspending upper electrode plate and a cantilever beam after removing part of a buried oxide layer.

In step S400, the buried oxide layer exposed from the recessed portion 110 is removed to expose the second silicon layer 300, partial buried oxide layer is removed to suspend the upper electrode plate 120 and the cantilever beam 130. After the part of the buried oxide layer is removed, the remaining part of the buried oxide layer 210 supports the peripheral region 140. In the embodiment, the buried oxide layer 200 exposed from the recessed portion 110 is removed by using a hydrofluoric acid to expose the second silicon layer 300. The partial buried oxide layer 200 is removed by using a hydrofluoric acid to suspend the upper electrode plate 120 and the cantilever beam 130. The portion which is difficult to be removed can be drilled and then removed by the hydrofluoric acid. Because a position between the upper electrode plate and the second silicon layer 300 is suspended, a corresponding portion of the second silicon layer 300 projected by the upper electrode plate 120 forms a lower electrode plate, the remaining part of the buried oxide layer 210 is equivalent to the supporting structure herein. FIG. 5 is a schematic view of a suspending upper electrode plate and a cantilever beam after removing part of the buried oxide layer.

Figure 6:
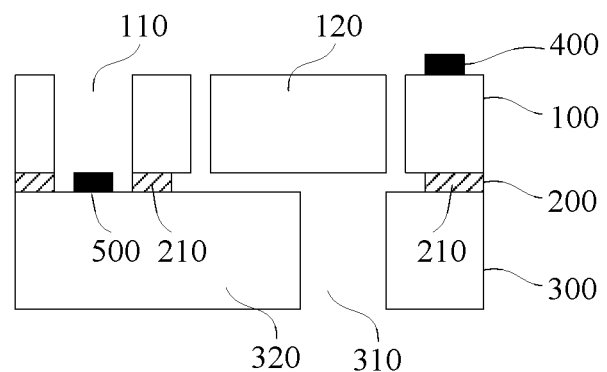
FIG. 6 is a schematic view of an MEMS torsional electrostatic actuator after an upper contact electrode and a lower contact electrode are manufactured.

In step S500, an upper contact electrode 400 and a lower contact electrode 500 are formed on the peripheral region 140 and the second silicon layer exposed from the recessed portion 110, respectively. Referring to FIG. 6, the upper contact electrode 400 and the lower contact electrode 500 are formed on the peripheral region 140 and the second silicon layer exposed from the recessed portion 110, respectively, by depositing a metal layer and patterning the metal layer. It is easy to learn that, the upper contact electrode 400 and the lower contact electrode 500 are metal electrodes. The upper contact electrode 400 and the upper electrode plate 120 establish an electrical connection, the lower contact electrode 500 and the lower electrode plate 320 establish an electrical connection. When a voltage is applied to the upper contact electrode 400 and the lower contact electrode 500, due to an effect of the electrostatic force, the upper electrode plate 120 will move. Because the upper electrode plate 120 and the lower electrode plate 320 are not totally overlapped (having a difference of 40% to 60%), the force subjecting to the upper electrode plate 120 is uneven. An electrostatic force subjected by the portion of the upper electrode plate 120 which corresponds to the lower electrode plate 320 is greater than an electrostatic force subjected by a corresponding portion of the back cavity 310, causing the cantilever beam 130 to be torque and the upper electrode plate 120 to take a torsion movement.

In the method of manufacturing an MEMS torsional electrostatic actuator, the silicon wafer based upon an insulator (SOI, Silicon on Insulator) serves as a substrate, taking advantage of patterning the first silicon layer, the buried oxide layer and the second silicon layer, forming an upper electrode plate on the first silicon layer, forming a lower electrode plate (a region of the second silicon layer that is not covered by the back cavity and corresponds to the upper electrode plate) on the second silicon layer, the buried oxide layer serves as an insulating layer and a sacrificial layer between the upper electrode plate and the lower electrode plate, the overlapping area between the upper electrode plate and the lower electrode plate is about 40% to 60%. When a voltage is applied to the upper contact electrode and the lower contact electrode, due to an effect of the electrostatic force, the upper electrode plate will move. Because the upper electrode plate and the lower electrode plate are not totally overlapped (having a difference of 40% to 60%), thus the force subjecting to the upper electrode plate is uneven. An electrostatic force subjected by the portion of the upper electrode plate which corresponds to the lower electrode plate is greater than an electrostatic force subjected by the corresponding portion of the back cavity, causing the cantilever beam to be torque and the upper electrode plate to take a torsion movement, this is MEMS torsional electrostatic actuator, also known as MEMS torsional capacitor actuator. The MEMS torsional electrostatic actuator takes advantage of the torque cantilever beam and the electrostatic force to drive the upper electrode plate to torque, realizing a relatively large driving force output and a relative larger dynamic range. In addition, SOI has a relative larger thickness, a better consistency and a lower residual stress, therefore, the manufacturing process is easy to be controlled, and the manufactured MEMS torsional electrostatic actuator has a relative low residual stress, thus possessing a better performance.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A method of manufacturing an MEMS torsional electrostatic actuator, comprising:
    providing a substrate comprising a first silicon layer, a buried oxide layer, and a second silicon layer that are laminated sequentially;
    patterning the first silicon layer and exposing the buried oxide layer to form a rectangular upper electrode plate spaced apart from a peripheral region, wherein the upper electrode plate is connected to the peripheral region merely via a cantilever beam, and forming a recessed portion on the peripheral region to expose the buried oxide layer simultaneously; patterning the second silicon layer and exposing the buried oxide layer to form a back cavity, wherein the back cavity is located in a region of the second silicon layer corresponding to the upper electrode plate, and the back cavity covers 40% to 60% of the area of the region corresponding to the upper electrode plate, and the back cavity is adjacent to an end of the cantilever beam;
    removing the buried oxide layer that is exposed from the recessed portion to expose the second silicon layer, and removing partial buried oxide layer to suspend the upper electrode plate and the cantilever beam; and
    forming an upper contact electrode and a lower contact electrode on the peripheral region and the second silicon layer exposed from the recessed portion, respectively.

2. The method according to claim 1, wherein a resistivity of the first silicon layer and the second silicon layer range from 0.001 Ω·cm to 0.01 Ω·cm.

3. The method according to claim 1, wherein the first silicon layer and the second silicon layer are made of monocrystalline silicon.

4. The method according to claim 1, wherein the first silicon layer has a thickness ranging from 5 micrometers to 50 micrometers.

5. The method according to claim 1, wherein the buried oxide layer has a thickness ranging from 0.5 micrometers to 2 micrometers.

6. The method according to claim 1, wherein the second silicon layer has a thickness ranging from 400 micrometers to 600 micrometers.

7. The method according to claim 1, wherein a number of the cantilever beams is two, and the back cavity is adjacent to an inner end of any one of the cantilever beams.

8. The method according to claim 1, wherein the buried oxide layer exposed from the recessed portion is removed by using a hydrofluoric acid to expose the second silicon layer, the partial buried oxide layer is removed by using a hydrofluoric acid to suspend the upper electrode plate and the cantilever beam.

9. The method according to claim 1, wherein the back cavity is located in a region of the second silicon layer corresponding to the upper electrode plate, and the back cavity covers 40% to 60% of the area of the region corresponding to the upper electrode plate.

10. The method according to claim 1, wherein the back cavity is located in a region of the second silicon layer corresponding to the upper electrode plate, and the back cavity covers 50% of the area of the region corresponding to the upper electrode plate.

11. The method according to claim 1, wherein the upper contact electrode and the lower contact electrode are formed on the peripheral region and the second silicon layer exposed from the recessed portion, respectively, by depositing a metal layer and patterning the metal layer.

* * * * *